United States Patent
Hamada

(10) Patent No.: US 10,338,465 B2
(45) Date of Patent: Jul. 2, 2019

(54) PELLICLE FRAME AND PELLICLE

(71) Applicant: SHIN-ETSU CHEMICAL CO., LTD., Tokyo (JP)

(72) Inventor: Yuichi Hamada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 34 days.

(21) Appl. No.: 15/678,442

(22) Filed: Aug. 16, 2017

(65) Prior Publication Data

US 2018/0059536 A1    Mar. 1, 2018

(30) Foreign Application Priority Data

Aug. 24, 2016    (JP) ................................ 2016-163848

(51) Int. Cl.
     *G03F 1/64*      (2012.01)

(52) U.S. Cl.
     CPC ...................... *G03F 1/64* (2013.01)

(58) Field of Classification Search
     CPC ........................................................ G03F 1/64
     USPC ............................................................ 430/5
     See application file for complete search history.

(56) References Cited

U.S. PATENT DOCUMENTS

| | | | |
|---|---|---|---|
| 5,470,621 A | 11/1995 | Kashida et al. | |
| 9,395,634 B2 * | 7/2016 | Sekihara | C23C 4/08 |
| 2007/0292775 A1 | 12/2007 | Hamada | |
| 2012/0122025 A1 | 5/2012 | Murakami et al. | |

FOREIGN PATENT DOCUMENTS

| | | |
|---|---|---|
| EP | 1868033 A2 | 12/2007 |
| EP | 2267527 A2 | 12/2010 |
| EP | 2793081 A1 | 10/2014 |
| JP | 2007333910 A | 12/2007 |

OTHER PUBLICATIONS

Jan. 29, 2018 Search Report issued in European Patent Application No. 17187306.0.

\* cited by examiner

*Primary Examiner* — Christopher G Young
(74) *Attorney, Agent, or Firm* — Oliff PLC

(57) ABSTRACT

There is provided a pellicle frame which prevents particles such as carbon black particles or filler particles from contaminating a photomask even when stray light hits the inside face of the pellicle frame in the exposure step of photolithography. More specifically, provided are a pellicle frame including a frame base, and a polymer coating layer coating at least an inner circumferential surface of the frame base, the polymer coating layer including an outermost polymer layer on a side farthest away from the frame base and one or more inner polymer layers between the frame base and the outermost polymer layer, wherein at least one of the one or more inner polymer layers contains particles, and the outermost polymer layer contains no particles or has a particle concentration lower than a highest particle concentration among the one or more inner polymer layers; and a pellicle including the pellicle frame.

12 Claims, 1 Drawing Sheet

PELLICLE FRAME AND PELLICLE

BACKGROUND OF THE INVENTION

1. Field of the Invention

The present invention relates to a pellicle for lithography used as a dust cover for a photomask in the production of devices such as semiconductor devices and liquid crystal displays and to a pellicle frame which the pellicle comprises.

2. Related Art

In the production of semiconductor devices such as LSIs and super-LSIs, liquid crystal displays or similar devices, photolithographic technique is used to irradiate a semiconductor wafer or an original plate for liquid crystal with light for formation of a pattern.

In the photolithographic step, when dust adheres to a photomask (exposure original plate), the dust absorbs light or bends light to cause problems in dimensions, quality or an appearance, such as deformation of a transferred pattern, rough edges, or black stain on a base. To address these problems, such a step is typically carried out in a clean room, but it is still difficult to keep a photomask completely clean even in a clean room. Hence, to prevent dust from adhering, a pellicle that sufficiently transmits exposure light is typically attached to a surface of the photomask. As a result, dust does not directly adhere onto the surface of a photomask but adheres onto the pellicle film. When the focus during exposure is set on the pattern on a photomask, the dust on the pellicle film does not interfere with the transfer.

The structure of a typical pellicle is shown in FIG. 2. A pellicle film 101 which sufficiently transmits exposure light is provided over the upper end face of a pellicle frame 102 through an adhesive 103, and an adhesive layer 104 for attaching the pellicle to a photomask 105 is formed on the lower end face of the pellicle frame 102. A separator (not shown) for protecting the adhesive layer 104 may be releasably provided on the lower end face of the adhesive layer 104. Such a pellicle is placed to cover a pattern region 106 formed in the surface of a photomask. Accordingly, the pattern region is isolated by the pellicle from the outside, and dust is prevented from adhering onto a photomask.

In recent years, the design rule of LSIs has been miniaturized to sub-quarter-micron patterns so that the size of particles to be suppressed as contamination has been further miniaturized. In addition, as exposure light has had a shorter wavelength, exposure is likely to cause a haze due to particles. Hence, a conventional pellicle frame treated with alumite (anodization treatment) has become avoided due to contamination of sulfate ions, and a pellicle having a frame coated with a polymer and eluting no sulfate ions has come to be used (JP 2007-333910A). As the polymer coating, a matte black electrodeposition coating film prepared by using a matte coating material colored with a black pigment is used (JP 2007-333910A).

SUMMARY OF THE INVENTION

In the exposure step of photolithography, exposure light is typically set so as not to hit a pellicle frame. However, light reflected by, for example, edges of a pattern, or a part of diffracted light (stray light) may hit the inside face of a pellicle frame. When such stray light hits the inside face of a pellicle frame coated with a polymer, the polymer coating layer may be etched, and pigment particles or other particles dispersed in the coating layer may fall off.

The stray light hitting the inside face of a pellicle frame is thought to be up to about 1.5% of the ArF laser intensity applied to the pattern region of a photomask. The current pellicle film for ArF is required to have a light resistance of about 100,000 J, so that the inside face of a pellicle frame is correspondingly required to have a light resistance of about 1,500 J.

Accordingly, an object of the invention is to provide a pellicle frame which prevents particles such as carbon black particles or filler particles from contaminating a photomask even when stray light hits the inside face of the pellicle frame in the exposure step of photolithography and a pellicle comprising the pellicle frame.

In an aspect of the invention, there can be provided a pellicle frame comprising a frame base, and a polymer coating layer coating at least an inner circumferential surface of the frame base, the polymer coating layer comprising an outermost polymer layer on a side farthest away from the frame base and one or more inner polymer layers between the frame base and the outermost polymer layer, wherein at least one of the one or more inner polymer layers contains particles, and the outmost polymer layer contains substantially no particles or has a particle concentration lower than a highest particle concentration among the one or more inner polymer layers.

In another aspect of the invention, there can be provided a pellicle comprising the pellicle frame, a pellicle film provided over an upper end face of the pellicle frame, and an adhesive applied on a lower end face of the pellicle frame.

In still another aspect of the invention, there can be provided a method for producing a pellicle frame, comprising the steps of: subjecting at least an inner circumferential surface of a frame base to first electrodeposition coating with a mixture of a first polymer and first particles to form an inner polymer layer having a concentration A of the first particles, and subjecting the inner polymer layer to second electrodeposition coating with a second polymer or with a mixture of a second polymer and second particles to form an outermost polymer layer, wherein the outermost polymer layer contains substantially none of the second particles or has a concentration of the second particles lower than the particle concentration A.

In the pellicle frame according to the invention, the polymer coating layer comprises two or more polymer layers for lamination which are formed on the frame base, wherein the outermost polymer layer contains no particles or has a particle concentration lower than the highest particle concentration among the one or more inner polymer layers. This structure can prevent contamination of a photomask even when stray light hits the inside face of the pellicle frame. As compared with a conventional pellicle frame coated with a polymer, the pellicle frame according to the invention allows an irradiation amount or energy of exposure light to be increased.

DETAILED DESCRIPTION OF THE PREFERRED EMBODIMENTS

Figure 1:
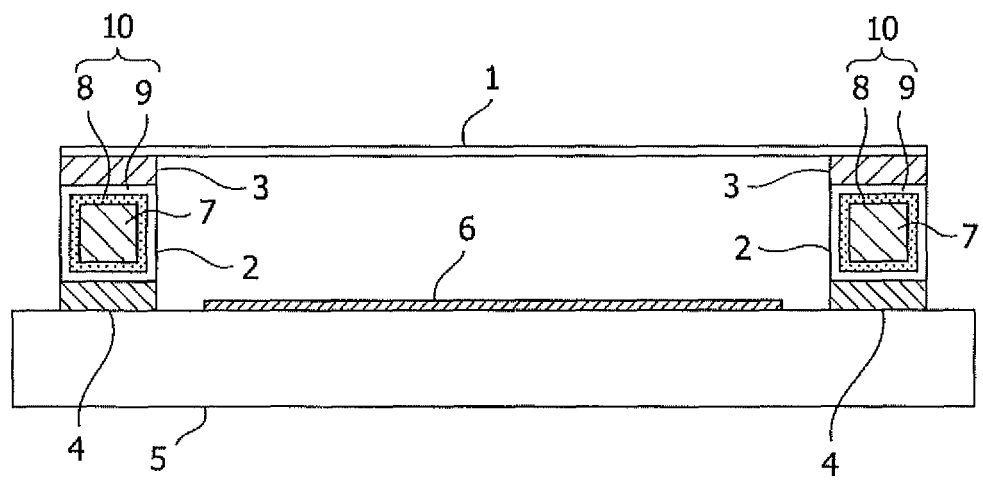
FIG. 1 is a schematic cross-sectional view of an embodiment of a pellicle according to the invention.
Figure 2:
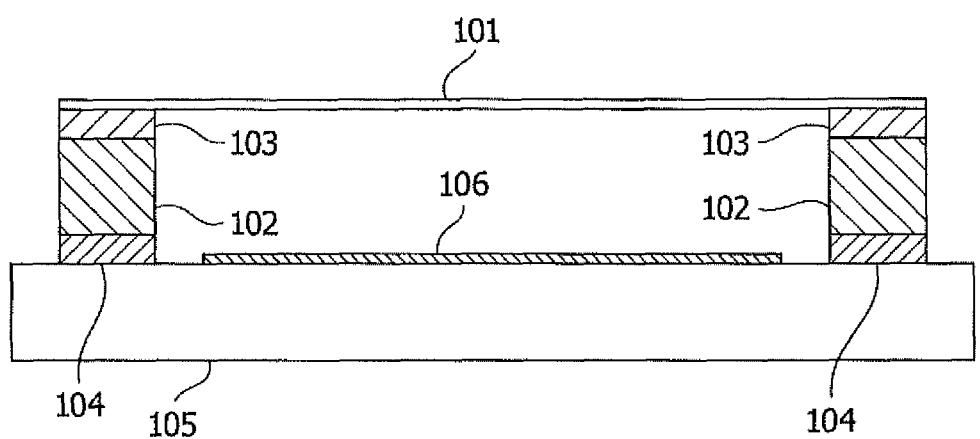
FIG. 2 is a schematic cross-sectional view showing a typical structure of a conventional pellicle.

The invention will be described in detail. It should not be construed that the invention is limited to or by the embodiments.

A pellicle frame corresponds to the shape of a photomask to which the pellicle is attached, and typically has a quadrangular frame shape (a rectangular frame shape or a square frame shape).

The pellicle frame may have a pressure-adjusting hole. When provided, the pressure-adjusting hole eliminates the difference in atmospheric pressure between the inside and the outside of the closed space defined by a pellicle and a photomask, and can prevent a pellicle film from swelling or deflating.

A dust filter is preferably attached to the pressure-adjusting hole. The dust filter can prevent foreign substances from entering through the pressure-adjusting hole into the closed space defined by a pellicle and a photomask.

The material of the dust filter is exemplified by resins, metals, and ceramics. A chemical filter is also preferably provided to the outer side of the dust filter to adsorb or decompose chemical substances in the environment.

The inner circumferential surface of the pellicle frame or the inner wall surface of the pressure-adjusting hole may be coated with an adhesive to capture foreign substances present in the closed space defined by a pellicle and a photomask.

The frame base of the pellicle frame is not particularly limited, and known materials can be used for the frame base. Examples of the material include aluminum, aluminum alloys, iron, iron alloys, ceramics, ceramic-metal composite materials, carbon steel, tool steel, stainless steel, and carbon fiber composite materials. It is preferable to use a metal frame base including an aluminum frame base and an aluminum alloy frame base from the standpoint of strength, rigidity, lightweight, processability, cost and others.

Before being coated with a polymer coating layer, the surface of the frame base is preferably roughened by sandblasting or chemical polishing. A conventionally known method may be used for the surface-roughening of the frame base. For example, a surface of an aluminum alloy frame base may be subjected to blast treatment with stainless steel, carborundum, glass beads or the like, or subjected to chemical polishing with an alkaline solution such as a sodium hydroxide solution.

The frame base is coated with a polymer coating layer comprising two or more layers for lamination. In the polymer coating layer, the outermost polymer layer on a side farthest away from the frame base contains no particles or has a particle concentration lower than the highest particle concentration among the one or more inner polymer layers.

The whole surface of the frame base is not necessarily coated with the polymer coating layer. It is sufficient to coat at least the inner circumferential surface of the frame base. The inner circumferential surface to be coated is preferably the whole surface of the inner circumferential surface, but may be a part of the inner circumferential surface which, for example, is likely to be hit by stray light and thus needs reinforcement. The polymer coating layer may be a lamination comprising at least two layers of the outermost polymer layer on a side farthest away from the frame base and an inner polymer layer on a side close to the frame base, wherein the inner polymer layer has a higher particle concentration than that of the outermost polymer layer. For example, the whole surface of a frame base may be coated with a first polymer layer containing pigment particles and/or filler particles, and only the inner circumferential surface of the pellicle frame base may be further coated with a second polymer layer.

Examples of the resin to be used in the polymer coating layer are various and include epoxy resins, acrylic resins, aminoacrylic resins and polyester resins. The resin may be selected from known resins in consideration of heat resistance, light resistance, strength, and other characteristics.

As for the lamination of at least two layers contained by the polymer coating layer, each layer in the polymer coating layer preferably contains the same polymer. Such a structure is unlikely to cause defects such as detachment of one polymer layer from the other polymer layer at their interface.

Each of the polymer layers for forming the polymer coating layer may optionally contain particles, but the particle concentration in the outermost polymer layer is made lower than the maximum of the particle concentrations among the one or more inner polymer layers. At least one of the inner polymer layers may contain particles. The highest (i.e. maximum) particle concentration among the particle concentrations of the inner polymer layers is preferably 5 to 20% by weight. The outermost polymer layer preferably has a particle concentration of 0.5 to 5.0% by weight, and more preferably contains substantially no particles. The particles are preferably pigment particles and/or filler particles.

By adding pigment particles or the like to one or more inner polymer layers contained by the polymer coating layer, the one or more polymer layers have a visible light transmittance of preferably 50% or less, more preferably 20% or less. The outermost polymer layer has a visible light transmittance of preferably more than 50%, more preferably 80% or more. The visible light transmittance can be determined by using a commercially available spectrophotometer.

With such a structure, the polymer coating layer can have a black color tone even when a resin used for the polymer coating layer is a material that comparatively highly transmits visible light, and an outermost polymer layer does not contain particles such as pigment particles and is transparent. The polymer coating layer with a black color tone facilitates the detection of foreign substances in a foreign substance inspection, enabling the production of an advantageous pellicle.

With such a structure, the inner circumferential surface of the pellicle frame is preferably selected to have an emissivity of 0.80 to 0.99. The "emissivity" is determined as the ratio of $P_1/P$, wherein P is the total emitting energy on the basis of a black body, which is an idealized physical body that absorbs all wavelengths incident to the surface without reflection or transmission, and $P_1$ is an energy emitted by a physical body, and may be determined by using an emissivity meter, TSS-5X, manufactured by Japan Sensor.

The pigment is exemplified by carbon black. The filler is exemplified by kaolin, synthetic $SiO_2$, and epoxy resins. The pigment and the filler may be appropriately selected as needed. The average particle size of particles such as pigment particles or filler particles may be determined by dynamic light scattering or SEM observation. The carbon black preferably has a particle size of 40 to 100 nm. The filler preferably has a particle size of 1.0 to 3.0 μm.

When the polymer coating layer comprises two layers of an outermost polymer layer and an inner polymer layer, the inner polymer layer preferably has a pigment particle concentration of 0.5 to 5.0% by weight, and the inner polymer layer preferably has a filler particle concentration of 5 to 20% by weight.

The thickness of the polymer coating layer is not particularly limited. In consideration of the energy of ArF laser light typically used as exposure light, when the polymer coating layer comprises two layers of an outermost polymer layer and an inner polymer layer, the outermost polymer layer has a thickness of preferably 2 μm or more, more preferably 2.0 to 10.0 μm, and the inner polymer layer preferably has a thickness of 1.0 to 5.0 µm. When the polymer coating layer contains three or more layers, the thickness of the outermost polymer layer is preferably 2 µm or more, more preferably 2.0 to 10.0 µm, and the thickness of inner polymer layers is preferably 1.0 to 5.0 µm, and the total thickness of the polymer coating layers is preferably 5.0 to 15.0 µm from the standpoint of the appearance of the frame coating film.

Each polymer layer can be provided by various types of methods. Examples of the commonly used methods include spray coating, electrostatic coating, and electrodeposition coating. The electrodeposition coating is preferable from the standpoint of the uniformity of film thickness, film smoothness, or other advantages.

The pellicle frame is preferably produced by a method comprising the steps of subjecting at least the inner circumferential surface of a frame base to electrodeposition coating with a mixture of a polymer and particles to form an inner polymer layer; and subjecting the inner polymer layer to electrodeposition coating with a polymer to form an outermost polymer layer containing no particles.

For the electrodeposition coating, any of thermosetting resins and ultraviolet curable resins can be used. In each step, either anionic electrodeposition coating or cationic electrodeposition coating may be used. The anionic electrodeposition coating, in which a material to be coated is used as a positive electrode, is preferred because an amount of generating gas is small so that the possibility of causing defects such as pinholes in a coating film is lowered.

A coating apparatus and a coating material to be used for the electrodeposition coating are commercially available from some companies. For example, an electrodeposition coating material, Elecoat (trade name), is commercially available from Shimizu Co., Ltd.

A pellicle comprises a pellicle frame, a pellicle film provided over the upper end face of the pellicle frame, and an adhesive applied on the lower end face of the pellicle frame.

The pellicle film may be made of any material, but may be preferably made of a material having a high transmittance at the wavelength of exposure light and having high light resistance. For example, an amorphous fluoropolymer conventionally used for excimer laser is used. Examples of the amorphous fluoropolymer include Cytop (trade name manufactured by Asahi Glass Co., Ltd.), Teflon (registered trademark), and AF (trade name manufactured by DuPont). When a pellicle film is produced, such a polymer may be optionally dissolved in a solvent such as a fluorine-containing solvent. When EUV (Extreme Ultraviolet) light is used as the exposure light, an ultrathin silicon film having a film thickness of 1 µm or less or a graphene film may be used.

In a step of bonding a pellicle film to the pellicle frame, a surface of the pellicle frame is subjected to application of a good solvent for the pellicle film and air-dried, and then the pellicle film is bonded to the pellicle frame. Alternatively, an acrylic resin adhesive, an epoxy resin adhesive, a silicone resin adhesive, a fluorine-containing silicone adhesive, or a similar adhesive can be used to bond a pellicle film to the pellicle frame.

An adhesive layer is provided on the lower end face of the pellicle frame for attaching the pellicle to a photomask. Typically, an adhesive is provided over the entire circumference on the lower end face of the pellicle frame at the same width as or a smaller width than that of the pellicle frame. The thickness of the adhesive layer is preferably 0.2 to 0.5 mm.

The adhesive layer may be a layer of a known adhesive such as a rubber adhesive, a urethane adhesive, an acrylic adhesive, an SEBS (Styrene Ethylene Butylene Styrene) adhesive, an SEPS (Styrene Ethylene Propylene Styrene) adhesive, and a silicone adhesive. When EUV light is used as the exposure light, a silicone adhesive having excellent light resistance and the like is preferably used. An adhesive unlikely to cause outgassing, which can cause haze, is also preferably used.

A separator typically provided on the lower end face of the adhesive layer may be omitted, for example, by modification of a pellicle-storing container. When provided, the separator may be a film made of, for example, polyethylene terephthalate (PET), polytetrafluoroethylene (PTFE), tetrafluoroethylene-perfluoroalkyl vinyl ether copolymer (PFA), polyethylene (PE), polycarbonate (PC), polyvinyl chloride (PVC), or polypropylene (PP). A release agent such as a silicone release agent and a fluorine release agent may be optionally applied to the surface of a separator.

A schematic cross-sectional view of an embodiment of the pellicle according to the invention is shown in FIG. 1. A pellicle frame 2 comprises a frame base 7 and a polymer coating layer 10 coating the whole surface of the frame base 7. The polymer coating layer 10 comprises an inner polymer layer 8 on a side close to the frame base 7 and an outermost polymer layer 9 on a side farthest away from the frame base 7, wherein the inner polymer layer 8 contains particles and the outermost polymer layer 9 contains no particles. A pellicle film 1 which sufficiently transmits exposure light is provided over the upper end face of the pellicle frame 2 through an adhesive 3. An adhesive layer 4 for attaching the pellicle to a photomask 5 is formed on the lower end face of the pellicle frame 2. A separator (not shown) for protecting the adhesive layer may be releasably provided on the lower end face of the adhesive layer 4. Such a pellicle is placed to cover a pattern region 6 formed in the surface of a photomask. Accordingly, the pattern region is isolated by the pellicle from the outside, and dust is prevented from adhering onto the photomask.

EXAMPLES

The invention will next be described with reference to Examples and Reference Examples. It should not be construed that the invention is limited to or by Examples.

Example 1

First, an aluminum frame having frame external dimensions of 149 mm×115 mm×3.15 mm and a frame thickness of 2 mm was provided as a frame base. Next, an electrodeposition coating material containing 1.0% by weight of carbon black, 6.0% by weight (particle concentration) of a filler, and Elecoat AM (trade name) manufactured by Shimizu Co., Ltd. was used to subject the frame base to anionic electrodeposition coating. As a result, an inner polymer layer having a thickness of about 5.2 µm was formed on the whole surface of the frame base. The inner polymer layer had a transmittance of 1 to 10% in the visible light region. The Elecoat AM containing no pigment particles or filler particles was used to further perform anionic electrodeposition coating to form an outermost polymer layer (as the second layer) on the whole surface of the inner polymer layer. The outermost polymer layer had a thickness of about 6.0 µm. The outermost polymer layer had a transmittance of 80 to 90% in the visible light region. The frame base which had been subjected to the electrodeposition coating was heated at 200° C. for 60 minutes to cure the outermost polymer layer. The inner circumferential surface of the pellicle frame obtained in this manner had an emissivity of 0.90 to 0.99. A pellicle film (prepared from Cytop Type S manufactured by Asahi Glass Co., Ltd., a film thickness of 0.28 μm) was provided over the upper end face of the pellicle frame thus obtained through an adhesive (Cytop Type A manufactured by Asahi Glass Co., Ltd.). An adhesive layer of a silicone adhesive (X-40-3264 manufactured by Shin-Etsu Chemical Co., Ltd.) was formed on the lower end face. Consequently, a pellicle was formed.

The inside face of the frame of the formed pellicle was irradiated with ArF laser of 5 mJ/cm$^2$/pulse and 500 Hz. After 30 minutes of the irradiation with ArF laser (integrated energy: 4,500 J), a piece of CELLOTAPE™ was attached to the inside face of the frame and then peeled. The peeled piece was observed under a microscope. No carbon black or filler was observed.

Example 2

A pellicle was formed in the same manner as in Example 1 except that a thickness of the outermost polymer layer was made about 2.1 μm. The outermost polymer layer had a transmittance of 80 to 90% in the visible light region, and the inner circumferential surface of the pellicle frame had an emissivity of 0.90 to 0.99.

The inside face of the frame of the formed pellicle was irradiated with ArF laser of 5 mJ/cm$^2$/pulse and 500 Hz. After 10 minutes of the irradiation with ArF laser (integrated energy: 1,500 J), a piece of CELLOTAPE™ was attached to the inside face of the frame and peeled. The peeled piece was observed under a microscope. No carbon black or filler was observed.

Example 3

A pellicle was formed in the same manner as in Example 1 except that the thickness of the outermost polymer layer made about 1.8 μm. The outermost polymer layer had a transmittance of 80 to 90% in the visible light region, and the inner circumferential surface of the pellicle frame had an emissivity of 0.90 to 0.99.

The inside face of the frame of the formed pellicle was irradiated with ArF laser of 5 mJ/cm$^2$/pulse and 500 Hz. After 5 minutes of the irradiation with ArF laser (integrated energy: 750 J) and after 10 minutes of the irradiation (integrated energy: 1,500 J), pieces of CELLOTAPE™ were attached to the inside face of the frame and peeled. The peeled pieces were observed under a microscope. After 5 minutes of the irradiation, no carbon black or filler was observed, but after 10 minutes of the irradiation, the carbon black and the filler were observed. It is evident from the result that the outermost polymer layer preferably has a thickness of 2 μm or more when ArF laser is used as the exposure light.

Comparative Example 1

First, an aluminum frame having frame external dimensions of 149 mm×115 mm×3.15 mm×3.5 mm and a frame thickness of 2 mm was provided as a frame base. Next, an electrodeposition coating material containing 0.5% by weight of carbon black and 1.0% by weight of a filler and Elecoat AM (trade name) manufactured by Shimizu Co., Ltd. was used to subject the frame base to anionic electrodeposition coating. As a result, a polymer layer having a thickness of about 6.5 μm was formed on the whole surface of the frame base. The frame base which had been subjected to the electrodeposition coating was heated at 200° C. for 60 minutes to cure the polymer layer. The polymer layer had a transmittance of 1 to 10% in the visible light region. The inner circumferential surface of the pellicle frame thus obtained had an emissivity of 0.90 to 0.99. A pellicle film was provided over the upper end face of the pellicle frame thus obtained through an adhesive. An adhesive layer was formed on the lower end face of the pellicle frame. Consequently, a pellicle was formed.

The inside face of the frame of the formed pellicle was irradiated with ArF laser of 5 mJ/cm$^2$/pulse and 500 Hz. After 5 minutes of the irradiation with ArF laser (integrated energy: 750 J) and after 10 minutes of the irradiation (integrated energy: 1,500 J), pieces of CELLOTAPE™ were attached to the inside face of the frame and peeled. The peeled pieces were observed under a microscope. After 5 minutes and after 10 minutes of the irradiation, the carbon black and the filler were observed.

The invention claimed is:

1. A pellicle frame comprising:
   a frame base, and
   a polymer coating layer coating at least an inner circumferential surface of the frame base, the polymer coating layer comprising an outermost polymer layer on a side farthest away from the frame base and one or more inner polymer layers between the frame base and the outermost polymer layer,
   wherein at least one of the one or more inner polymer layers contains particles, and the outmost polymer layer contains no particles or has a particle concentration lower than a highest particle concentration among the one or more inner polymer layers.

2. The pellicle frame according to claim 1, wherein the outermost polymer layer contains substantially no particles.

3. The pellicle frame according to claim 1, wherein the particles are pigment particles and/or filler particles.

4. The pellicle frame according to claim 1, wherein at least one of the inner polymer layers has a visible light transmittance of 50% or less.

5. The pellicle frame according to claim 1, wherein the outermost polymer layer has a visible light transmittance of more than 50%.

6. The pellicle frame according to claim 1, wherein the inner circumferential surface of the frame base coated with the polymer coating layer has an emissivity of 0.80 to 0.99.

7. The pellicle frame according to claim 1, wherein each layer in the polymer coating layer contains the same polymer.

8. The pellicle frame according to claim 1, wherein the outermost polymer layer has a thickness of 2 μm or more.

9. The pellicle frame according to claim 1, wherein each layer in the polymer coating layer is formed by electrodeposition coating.

10. A pellicle comprising:
    the pellicle frame according to claim 1;
    a pellicle film provided over an upper end face of the pellicle frame; and
    an adhesive applied on a lower end face of the pellicle frame.

11. A method for producing a pellicle frame, comprising the steps of:
    subjecting at least an inner circumferential surface of a frame base to first electrodeposition coating with a mixture of a first polymer and first particles to form an inner polymer layer having a concentration A of the first particles; and subjecting the inner polymer layer to second electrodeposition coating with a second polymer or with a mixture of a second polymer and second particles to form an outermost polymer layer, wherein the outermost polymer layer contains substantially none of the second particles or has a concentration of the second particles lower than the particle concentration A.

12. The method for producing a pellicle frame according to claim 11, wherein each of the first electrodeposition coating and the second electrodeposition coating is anionic electrodeposition coating.

* * * * *